United States Patent
Morgan et al.

(10) Patent No.: US 11,199,649 B2
(45) Date of Patent: Dec. 14, 2021

(54) METAMATERIAL, FOCAL PLANE ARRAY FOR BROAD SPECTRUM IMAGING

(71) Applicant: The United States of America, as represented by the Secretary of the Navy, Crane, IN (US)

(72) Inventors: Timothy Allen Morgan, Ellettsville, IN (US); Benjamin R. Conley, Bloomington, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/997,994

(22) Filed: Aug. 20, 2020

(65) Prior Publication Data

US 2021/0055454 A1 Feb. 25, 2021

Related U.S. Application Data

(60) Provisional application No. 62/889,725, filed on Aug. 21, 2019.

(51) Int. Cl.
*G02B 1/00* (2006.01)
*G01J 5/08* (2006.01)
*G01J 5/20* (2006.01)

(52) U.S. Cl.
CPC ............ *G02B 1/002* (2013.01); *G01J 5/0853* (2013.01); *G01J 5/20* (2013.01); *G01J 2005/202* (2013.01)

(58) Field of Classification Search
CPC ...... G02B 1/002; G02B 5/003; G02B 3/0056; G02B 3/0012; G01J 5/0853; G01J 5/20; G01J 2005/202; H01L 27/14812
See application file for complete search history.

(56) References Cited

U.S. PATENT DOCUMENTS

| | | | |
|---|---|---|---|
| 6,765,609 B1 * | 7/2004 | Kinoshita | G01J 3/2823 250/390.07 |
| 2014/0061469 A1 * | 3/2014 | Hwang | H01L 27/1464 250/338.4 |
| 2014/0131559 A1 * | 5/2014 | Yen | G02B 1/002 250/221 |
| 2016/0216201 A1 * | 7/2016 | Iwaszczuk | G01J 3/28 |
| 2017/0261377 A1 * | 9/2017 | Alves | G01J 5/40 |
| 2018/0151338 A1 * | 5/2018 | Conley | H04N 5/332 |
| 2018/0350574 A1 | 12/2018 | Conley | |
| 2020/0344430 A1 * | 10/2020 | Wang | H04N 5/35536 |

FOREIGN PATENT DOCUMENTS

WO WO-2015109678 A1 * 7/2015 ........... B81B 3/0081

* cited by examiner

*Primary Examiner* — Christine S. Kim
(74) *Attorney, Agent, or Firm* — Naval Surface Warfare Center, Crane Division; Eric VanWiltenburg

(57) ABSTRACT

The present invention relates to a metamaterial focal plane array for broad spectrum imaging. Electromagnetic energy in the form of light is absorbed in or on a metamaterial absorber and a subsequent hot carriers are collected either in a semiconductor space charge region (e.g. P-N junction), or in some other modern collection scheme. Following the accumulation of photogenerated charge (electrons or holes), the signal is then converted to a digital signal using conventional or slightly modified ROIC modules.

9 Claims, 3 Drawing Sheets

METAMATERIAL, FOCAL PLANE ARRAY FOR BROAD SPECTRUM IMAGING

CROSS-REFERENCE TO RELATED APPLICATIONS

The present application claims priority to U.S. Provisional Patent Application Ser. No. 62/889,725, filed Aug. 21, 2019, entitled "METAMATERIAL FOCAL PLANE ARRAY FOR BROAD SPECTRUM IMAGING," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,605) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION

The present invention relates to using metamaterials in a focal plane array for broad spectrum imaging.

BACKGROUND AND SUMMARY OF THE INVENTION

The present invention relates to a focal plane array for broad spectrum imaging. Imaging arrays in the infrared bands with cut-off wavelengths longer than ~1.8 µm require cooling to have a sufficient signal-to-noise ratio (SNR) for the ROIC and subsequent amplifying electronics. If cooling isn't applied, then thermally generated carriers in the material create a background noise level too high for reasonable image quality. Typical cooling requirements for imagers in the mid-wave infrared (MWIR) are in the range of 130-77 K, while most cooled long-wave infrared (LWIR) require cooling of <77 K. Research into novel ways of blocking the thermally created carriers and thus increasing the operating temperature has led to a concept of high operating temperature (HOT) MWIR. However, even those sensors require cooling of 140-130 K. Stand alone or isolated photodiodes and sensors have been demonstrated at higher operating temperatures in the MWIR and LWIR bands above 130 K; however, they have yet to be scaled to usable FPAs for imaging. FPAs that require cooling of ~100 K or below requires the use of a cryogenic cooler. Although alternative cooling technologies exist for systems with operating temperatures in the 130 K, a cryogenic cooler provides increased stability. As such all MWIR and most high sensitivity LWIR systems require a cooling to operate. This increases the size, weight, power, and cost of the imaging package. Uncooled infrared detectors do exist that work in the LWIR using a technology referred to as 'thermal detectors' by most in the field. That is because they work by sensing the change in imparted thermal energy to a sensor rather than performing the detection on a per photon basis. These types of FPAs are essentially miniaturized and highly scaled array of thermometers. These detectors can operate cooled or uncooled, but the uncooled performance is very near the cooled performance. So in most applications FPAs made of microbolometers and other thermal type detectors are operated uncooled. The detectivity of these thermal detectors is orders of magnitude below that of cooled photon based detectors. It is for this sensitivity trade-off that they are not widely adopted in critical or high sensitivity applications. Based on this aforementioned limitation of high sensitivity detectors requiring cooling and existing uncooled detectors having low sensitivity, a need exists in the commercial market for an uncooled MWIR and LWIR technology capable of high sensitivities and scalability. This patent proposes to solve this need.

According to an illustrative embodiment of the present disclosure, a metamaterial absorber is used to absorb light and provide a digital signal output through a read out integrated circuit (ROIC). In this process, electromagnetic energy in the form of light is absorbed in or on the metamaterial and the subsequent hot carriers are collected either in a semiconductor space charge region (e.g. P-N junction), or in some other modern collection scheme. Following the accumulation of photogenerated charge (electrons or holes), the signal is then converted to a digital signal using conventional or slightly modified ROIC modules. The process of getting the generated hot electrons from the surface of the metamaterial absorber is similar to that of a photoemissive detector. The overall process from light in to signal out is light absorption via polaritons, polariton decay into hot electrons, hot electrons are transported within the metal and semiconductor layers prior to encountering a barrier, the hot electron must then enter and be collected in the semiconductor for read out or storage which may involve overcoming a Schottky barrier.

According to a further illustrative embodiment of the present disclosure, a backside illumination scheme can be used by rearranging the layers.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
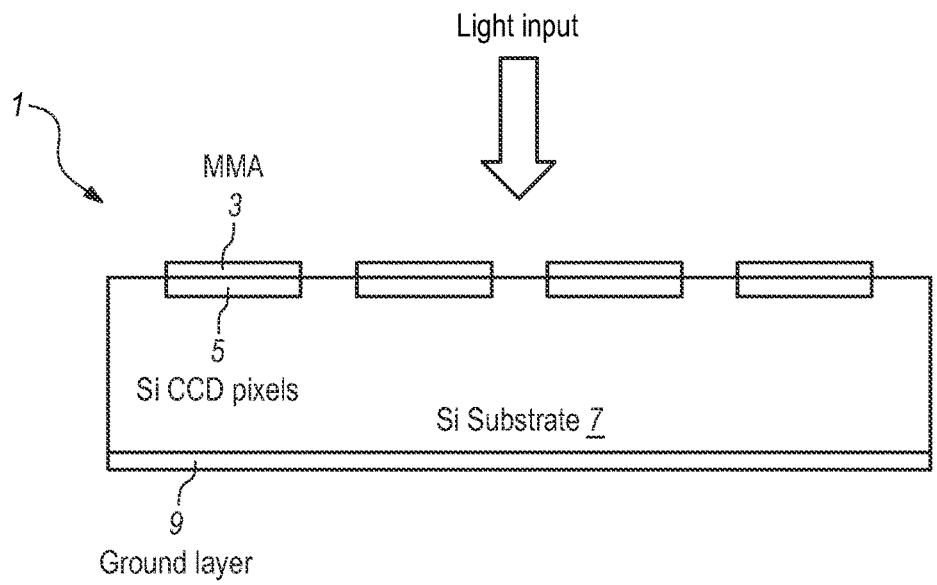
FIG. 1 shows a cross-section of a metamaterial focal plane array.

FIG. 1 shows an exemplary metamaterial focal plane array 1. A metamaterial absorber (MMA) 3 is used to absorb light and provide a digital signal output through a read out integrated circuit (ROIC). MMA 3 is coupled to a charge-coupled device (CCD) 5, with the MMA 3 and CCD 5 embedded within substrate 7. For front end illumination, ground layer 9 is coupled to the bottom of substrate 7. In this process, electromagnetic energy in the form of light is absorbed in or on the metamaterial and the subsequent hot carriers are collected either in a semiconductor space charge region (e.g. P-N junction), or in some other modern collection scheme. Following the accumulation of photogenerated charge (electrons or holes), the signal is then converted to a digital signal using conventional or slightly modified ROIC modules. The process of getting the generated hot electrons from the surface of the metamaterial absorber is similar to that of a photoemissive detector. A MMA 3 is an array of sub-wavelength features, arranged either in the X-Y plane, Z-plane, or all three, to create an artificial permittivity. This permittivity is different than the bulk materials that individually make up the MMA. To have an MMA with higher absorption, the artificial permittivity should be as close as possible to the impedance (Z) of free space, i.e. $Z=\sqrt{(\mu/\epsilon)}$. In this expression $\mu$ is the magnetic permeability ($\mu=\mu_r\mu_0$) and $\epsilon$ is the electric permittivity ($\epsilon=\epsilon_r\epsilon_0$). The MMA can be made up of a metal based absorbers or dielectric metamaterial patterns. The metal based absorbers rely upon the plasmonic response of the electrons to create the matching |E| and |H| fields necessary for impedance matching. This type of design typically requires a ground plane for |H| matching otherwise the maximum absorption possible is 50% (for more information see Coupled Mode Theory). A ground plane to achieve light absorption above 50% is possible as long as charge collection isn't impeded. Dielectric based MMA are designed as Mie resonance dielectric confinement structures. MMA can be readily made to suit the short wave infrared (SWIR), mid-wave infrared (MWIR), and long wave infrared (LWIR) imaging bands through a complement of geometry and dielectric functions. For example, in the case of a metal based MMA using Au; the resonant absorption band can be tuned from SWIR to LWIR through a modification of geometry comparable to the wavelength of interest. This is due to low dispersion of the real and complex dielectric permittivity of Au in those bands.

Figure 2:
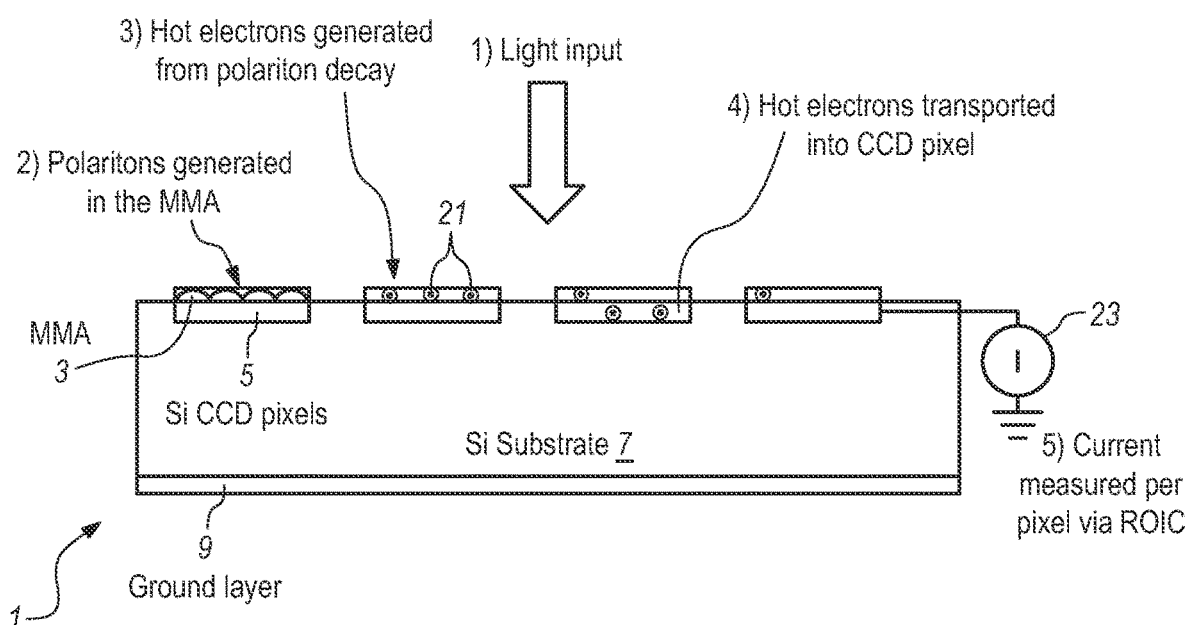
FIG. 2 shows a cross-section of a metamaterial imaging system.

FIG. 2 shows a process from absorption through detection for a wavelength thermal detector. In a first step, light is directed towards a metamaterial focal plane array 1. In a second step, light absorbed by MMA 3 generates plasmons. In a third step, the plasmons decay into hot electrons 21. In a fourth step, hot electrons 21 transport from the MMA 3 to the CCD pixel 5. In a fifth step, the current generated by CCD pixel 5 is detected and measured.

Figure 3:
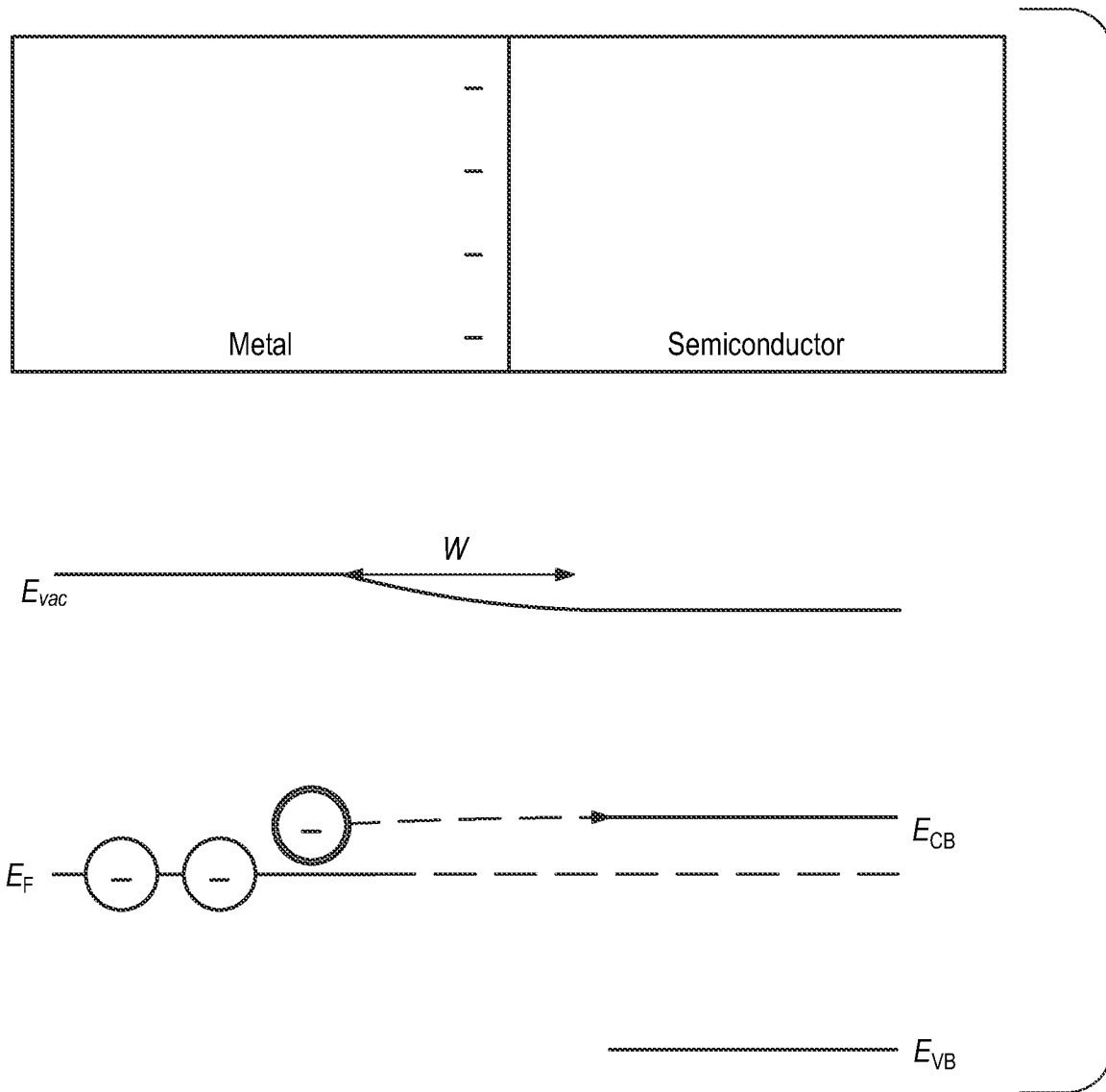
FIG. 3 shows a metal-semiconductor interface.

FIG. 3 shows a metal-semiconductor interface with a small Schottky barrier that is one possible scenario for the hot electrons to encounter. The absorption of light within the MMA creates plasmons which decay into hot electrons on the surface of the metal. This means that the boundary layers of metal/semiconductor and metal/dielectric with have an electron with an energy of at least k*T above the Fermi level, where k is Boltzmanns constant and T is the absolute temperature in units of Kelvin. For metal based MMA, the metal absorbing features have a higher efficiency if they have a minimal offset barrier between the metal and semiconductor (i.e. Ohmic contacts). It is possible for the device to function with a Schottky barrier between metal and semiconductor, but this design has a reduced internal quantum efficiency (IQE). The Schottky barrier design can be useful in creating a simple structure for charge separation in situations where a p-n or other junction isn't available. For designs where charge separation is accounted for by some other known means (e.g. p-n, p-in, nBn, pBp, etc.) then the maximum charge conversion efficiency (i.e. IQE) is dictated by the density of states of the metal with electrons having momentum matching in the semiconductor. The use of a dielectric MMA provides another avenue of light absorption. This approach provides a lower loss outside of the desired absorption band. This means it has a higher quality factor (Q-factor) than their metal counterparts. The trade-off with a dielectric MMA is the more difficult challenge of charge extraction due to the lower density of states and electrical mobility. To achieve MMA with dielectrics one must design a structure that when the confined, the |H| and |E| spectrally overlap. In this instance these dielectric Mie resonators will achieve 100% absorption. Work into dielectric MM and absorption outside of the imaging bands shows that lossy dielectrics improve overall absorption while also providing localized absorbing sites for potential charge extraction. This design has a charge creation that is mostly independent from the bandgap of the adjoining charge collection material. As such, the charge creation method can be selected based on independent design factors such as IQE, cost, pixel size, response speed, charge capacity, etc. For example, charge collection methods such as Schottky barrier, including 2D materials such as MoS2, WS2, n-type barrier n-type (nBn), photoconductor, photoemission, metal-insulator-metal (MIM), metal-semiconductor-metal (MSM), photodiode, avalanche photodiode (APD), and p-type barrier p-type (pBp) would work.

Figure 4:
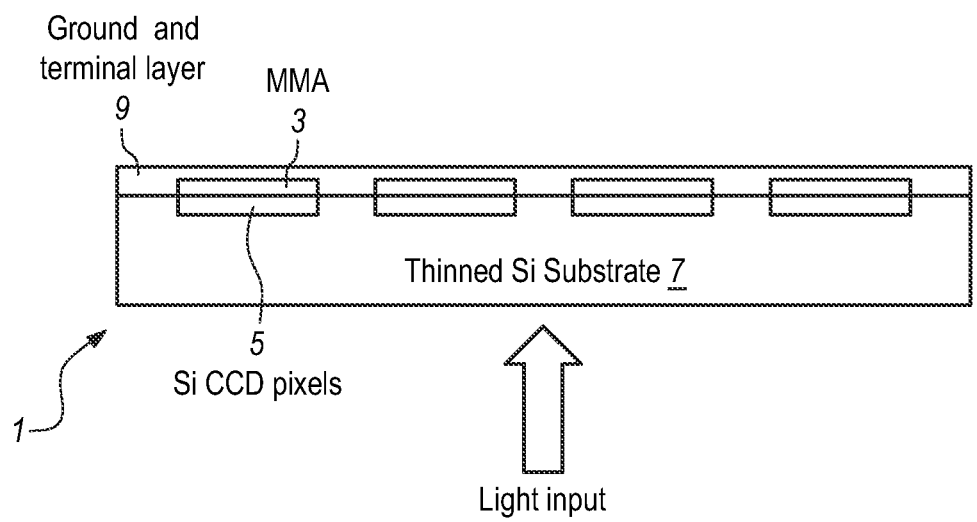
FIG. 4 shows a cross-section of a metamaterial focal plane array.

FIG. 4 shows a cross-section view of a metamaterial focal plane array 1 backside illumination scheme.

Figure 5:
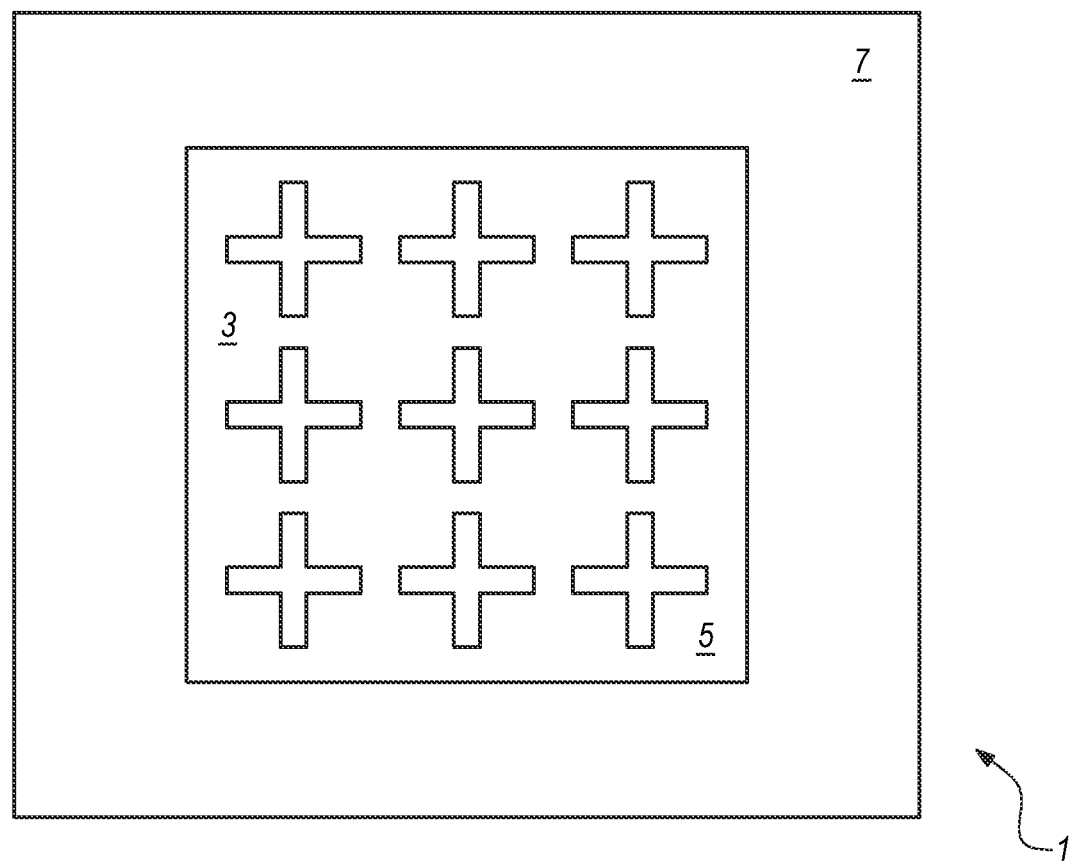
FIG. 5 shows a top-down view of a metamaterial focal plane array.

FIG. 5 shows a top-down view of a metamaterial focal plane array (as shown in FIG. 1).

Although the invention has been described in detail with reference to certain preferred embodiments, variations and modifications exist within the spirit and scope of the invention as described and defined in the following claims.

The invention claimed is:

1. A metamaterial focal plane array (MMFPA) comprising:
   at least one metamaterial absorber (MMA);
   at least one charge-coupled device (CCD), wherein a first side of each CCD of the at least one CCD is coupled to a corresponding MMA of the at least one MMA;
   a substrate layer, wherein a second side of each CCD of the at least one CCD is coupled to a first side of the substrate layer;
   a ground layer coupled to a second side of the substrate layer.

2. The MMFPA of claim 1, wherein the MMA comprises a metal.

3. The MMFPA of claim 2, wherein the MMA comprises gold.

4. The MMFPA of claim 3, wherein the CCD comprises silicon.

5. The MMFPA of claim 4, wherein the substrate layer comprises silicon.

6. The MMFPA of claim 1, wherein the MMA comprises a dielectric material.

7. A metamaterial focal plane array (MMFPA) comprising:
   at least one metamaterial absorber (MMA);
   at least one charge-coupled device (CCD), wherein a first side of each CCD of the at least one CCD is coupled to a corresponding MMA of the at least one MMA;
   a substrate layer, wherein a second side of each CCD of the at least one CCD is coupled to a first side of the substrate layer; and a ground layer coupled to first side of the substrate layer.

8. The MMFPA of claim 7, wherein the MMA comprises a metal.

9. The MMFPA of claim 7, wherein the MMA comprises a dielectric material.

* * * * *